United States Patent
Gorisse et al.

(10) Patent No.: US 9,450,563 B2
(45) Date of Patent: Sep. 20, 2016

(54) ACOUSTIC WAVE BANDPASS FILTER COMPRISING INTEGRATED ACOUSTIC GUIDING

(75) Inventors: Marie Gorisse, Chauray (FR); Alexandre Reinhardt, Saint Martin d'Heres (FR)

(73) Assignee: Commissariat a L'Energie Atomique et aux Energies Alternatives, Paris (FR)

( * ) Notice: Subject to any disclaimer, the term of this patent is extended or adjusted under 35 U.S.C. 154(b) by 440 days.

(21) Appl. No.: 13/879,598

(22) PCT Filed: Oct. 11, 2011

(86) PCT No.: PCT/EP2011/067728
§ 371 (c)(1),
(2), (4) Date: May 6, 2013

(87) PCT Pub. No.: WO2012/049174
PCT Pub. Date: Apr. 19, 2012

(65) Prior Publication Data
US 2013/0214878 A1 Aug. 22, 2013

(30) Foreign Application Priority Data

Oct. 15, 2010 (FR) ...................................... 10 58404

(51) Int. Cl.
*H03H 9/64* (2006.01)
*H03H 9/02* (2006.01)
(Continued)

(52) U.S. Cl.
CPC ....... *H03H 9/6433* (2013.01); *H03H 9/02015* (2013.01); *H03H 9/02047* (2013.01);
(Continued)

(58) Field of Classification Search
CPC ...... H03H 9/02086; H03H 9/56; H03H 9/54; H03H 9/564; H03H 9/6433; H03H 9/02047; H03H 9/02015; H03H 9/02543; H03H 9/547; H03H 9/0095; H03H 9/6436; H03H 9/6453; H03H 9/0033; H03H 9/02818; H03H 9/02653
USPC ............... 333/133, 186, 187, 189, 190, 191, 333/193–196; 310/312, 320
See application file for complete search history.

(56) References Cited

U.S. PATENT DOCUMENTS 5,495,135 A * 2/1996 Zimnicki et al. ............. 310/312
6,492,759 B1 12/2002 Watanabe
(Continued)

FOREIGN PATENT DOCUMENTS

GB 2352101 A1 1/2001

OTHER PUBLICATIONS

G.G. Fattinger et al., "Single-to-balanced Filters for Mobile Phones using Coupled Resonator", BAW Technology, 2004 IEEE Ultrasonics Symposium, pp. 416-419.
(Continued)

*Primary Examiner* — Benny Lee
*Assistant Examiner* — Jorge Salazar, Jr.
(74) *Attorney, Agent, or Firm* — Baker Hostetler LLP

(57) ABSTRACT

An acoustic wave bandpass filter comprises at least an input first acoustic wave resonator with an output surface, and an output second acoustic wave resonator with an input surface, said resonators being coupled to each other along a set direction, the input and output surfaces being substantially opposite, and at least one first phononic crystal structure between said input and output resonators and/or a second phonic crystal structure at the periphery of said resonators so as to guide the acoustic waves, generated by said input resonator, toward said output resonator along said set direction, the resonators ensuring an impedance conversion and/or a mode conversion.

26 Claims, 14 Drawing Sheets

(51) Int. Cl.
*H03H 9/56* (2006.01)
*H03H 9/54* (2006.01)
*H03H 9/00* (2006.01)

(52) U.S. Cl.
CPC ..... *H03H9/02086* (2013.01); *H03H 9/02543* (2013.01); *H03H 9/02653* (2013.01); *H03H 9/02818* (2013.01); *H03H 9/547* (2013.01); *H03H 9/564* (2013.01); *H03H 9/0033* (2013.01); *H03H 9/0095* (2013.01); *H03H 9/6436* (2013.01); *H03H 9/6453* (2013.01)

(56) References Cited

U.S. PATENT DOCUMENTS

| | | | |
|---|---|---|---|
| 7,939,987 B1* | 5/2011 | Solal et al. | 310/313 R |
| 2003/0155993 A1 | 8/2003 | Takamine et al. | |
| 2005/0212620 A1 | 9/2005 | Bauer et al. | |
| 2006/0103492 A1* | 5/2006 | Feng et al. | 333/187 |
| 2008/0246560 A1 | 10/2008 | Detlefsen | |
| 2009/0096549 A1 | 4/2009 | Thalhammer et al. | |
| 2009/0273415 A1 | 11/2009 | Frank et al. | |
| 2009/0295505 A1 | 12/2009 | Mohammadi et al. | |

OTHER PUBLICATIONS

C. Billard et al., "200mm Manufacturing Solution for Coupled Resonator Filters", Proceedings of the 39th European Solid-State Device Research Conference (ESSDERC 2009), pp. 133-136.

A.C. Hladky-Hennion et al., "Numerical analysis of negative refraction of transverse waves in an elastic material", Journal of Applied Physics, 104, n° 064906, 2008.

N.K. Kuo et al., "Demonstration of Inverse Acoustic Band Gap Structures in AlN and Integration with Piezoelectric Contour Mode Wideband Transducers", 2009 Solid-State Sensors, Actuators and Microsystems symposium, pp. 10-13, 2009.

N. Sinha et al., "Dual-beam actuation of piezoelectric AlN RF MEMS switches monolithically integrated with AlN contour-mode resonators", Solid-State Sensors, Actuators and Microsystems Workshop, Hilton Head Island, pp. 22-25, Jun. 1-5, 2008.

M.H. Lu et al., "Phononic crystals and acoustic metamaterials", Materials Today, 12, 12, pp. 34-42, 2009.

K.B. Gu, et al., "Design and Fabrication of 2D Phononic Crystals in Surface acoustic Wave Micro Devices", IEEE Micro Electro Mechanical Systems, Jan. 2006, pp. 686-689, XP010914338.

Tsung-Tsong Wu, et al., "Band Gap Materials and Micro-Phononic Devices", IEEE Frequency Control Symposium, Jun. 1, 2010, pp. 515-520, XP031738463.

Nai-Kuei Kuo, et al., "Evidence of Acoustic Wave Focusing in a Microscale 630 MHz Aluminum Nitride Phononic Crystal Waveguide", IEEE Frequency Control Symposium, Jun. 1, 2010, pp. 530-533XP031738462.

Vincent Laude, et al., "Surface Acoustic Wave Trapping in a Periodic Array of High Aspect Ratio Electrodes", IEEE Ultrasonics Symposium, Oct. 1, 2006, pp. 497-500, XP031076336.

Alexandre Reinhardt, et al., "Acoustic Technologies for Advanced RF Architectures", IEEE NEWCAS Conference, Jun. 20, 2010, pp. 161-164, XP031776896.

Kiyoshi Nakamura, et al., "Thin Film Resonators and Filters", International Symposium and Acoustic Wave Device for Futuremobile Communication Systems, Mar. 5, 2001, pp. 93-99, XP008048920.

* cited by examiner

ACOUSTIC WAVE BANDPASS FILTER COMPRISING INTEGRATED ACOUSTIC GUIDING

CROSS-REFERENCE TO RELATED APPLICATIONS

This application is a National Stage of International patent application PCT/EP2011/067728, filed on Oct. 11, 2011, which claims priority to foreign French patent application No. FR 1058404, filed on Oct. 15, 2010, the disclosures of which are incorporated by reference in their entirety.

FIELD OF THE INVENTION

The field of the invention is that of electromechanical devices using acoustic wave propagation through piezoelectric or electrostrictive layers to create electrical filter functions and, in addition, ensure electrical isolation between the input and output of the component.

BACKGROUND

Such devices have operating frequencies of the order of a few hundred MHz to a few GHz, and are used in radiofrequency transmission circuits (mobile phone, radio link, wireless exchange of data, etc.) signal processing or in sensor systems.

More specifically, the field of the present invention relates to electrical isolation, the input and output of a component with a view mainly to achieving an impedance and/or mode conversion in acoustic filters, therefore filters using acoustic resonators, mainly bulk wave (Bulk Acoustic Wave or BAW) resonators. These filters are located in the radiofrequency stage of audio transmission systems, notably in mobile phone systems. FIG. 1 shows a block digram of an RF stage. The signal coming from the antenna Is is directed toward two channels, filtered in a first so-called reception channel by a bandpass filter 1, then amplified by a low-noise amplifier 2 LNA, for Low Noise Amplifier), and blocked, in parallel, in a second so-called emission channel by a filter 3 so that the signal does not interfere with the signal emitted in the direction of the antenna. The signal coming from the antenna is, by construction, referenced to ground, and therefore asymmetric. On the other hand, in order to limit the noise added to the signal by the amplification stage, LNAs usually have differential accesses where the signal is no longer referenced to ground, but rather propagates in two 180° out-of-phase versions along the transmission lines.

To ensure the connection between the part of the chain referenced to ground and the differential part, it is possible to use an element external to the filter, inserted between the filter and amplifier or between the antenna and filter, called a balun (for Balanced/Unbalanced). Baluns are systems which take up a lot of space and introduce losses. Baluns can indeed be built using transmission line sections which should have centimeter dimensions at the currently used frequencies for mobile telephony (on the order of a few GHz), or more generally using magnetic windings similar to transformers, therefore requiring large areas (a few mm$^2$), and having non-negligible resistive losses.

CRF (Coupled Resonator Filter) filters, acoustically coupled filters, have already been proposed, enabling the mode conversion to be made G. G. Fattinger, J. Kaitila, R. Aigner and W. Nessler, *Single-to-balanced Filters for Mobile Phones using Coupled Resonator BAW Technology*, 2004 IEEE Ultrasonics Symposium, pp. 416-419, because by construction the input and output of the filter are electrically insulated: R. Thalhammer, M. M. Handtmann, J. Kaitila, W. Nessler, L. Elbrecht, Apparatus with acoustically coupled BAW resonators and a method for matching impedances, US patent 2009/0096549 A1, April 2009

FIGS. 2a and 2b show a filter with both mode-conversion and impedance-conversion in CRF technology, FIG. 2b showing the electrical connections of the resonators. The impedance conversion is obtained by the connection of two input resonators $R_{e1}$ and $R_{e2}$ and two output resonators, back to back, so as to increase by a factor of 4 the input impedance of the filter. The technological production of this filter is, however, very onerous, because it requires two resonators to be stacked on top of each other, and therefore a technology requiring the deposition of about fifteen layers and about twelve mask levels: C. Billard, N. Buffet, A. Reinhardt, G. Parat, S. Joblot and P. Bar, 200 *mm Manufacturing Solution for Coupled Resonator Filters*, Proceedings of the 39th European Solid-State Device Research Conference (ESS-DERC 2009), pp. 133-136.

Likewise, it is possible to stack resonators $R_1$ and $R_2$ of different thicknesses M. L. Franck, R. C. Ruby, T. Jamneala, Bulk Acoustic Resonator Electrical Impedance Transformers, US patent 2009/0273415 A1, November 2009, as indicated in FIG. 3. These resonators are acoustically coupled via the layer(s) Cc located between them. The resonators are stacked on top of a membrane produced on top of a cavity Ca made at the surface of a substrate S. Impedance conversion is achieved through the difference in thicknesses, the lower and upper resonators having, for a given area, different capacitances, and therefore different impedances. This solution raises the same manufacturing problems as the CRFs, namely requiring numerous layers to be stacked and numerous mask levels to be used. In addition, the thicknesses are fixed within certain limits by acoustic constraints (the desired frequencies, the bandwidth, the coupling coefficients of the modes used, etc.), not allowing all the desired conversion ratios to be obtained.

Moreover, in order to provide a filter with sufficient selectivity, it is often necessary to use two filter sections that, for reasons of technological complexity, are often connected at the level of the lower resonators as shown in FIG. 4, and using two types of stacks comprising piezoelectric materials $E_{piezo1}$ and $E_{piezo2}$, isolated by Bragg mirror structures $M_{R1}$ and $M_{R2}$, all the stacks being produced on the surface of a substrate S. The areas of these sections are then defined by the respective input and output impedances, while the thicknesses of the lower and upper resonators are defined by acoustic considerations, as specified earlier. Thus, the two lower resonators do not have the same impedance, the latter being defined by the formula $$Z_{res} = \frac{e_{piezo}}{2\pi \varepsilon_{piezo} S_{res} f_0}, \quad (1)$$

where $e_{piezo}$ is the thickness of the piezoelectric layer, $\varepsilon_{piezo}$ the dielectric constant of the piezoelectric material used, $f_0$ the central frequency of the filter, all these quantities being common to the lower resonators, and $S_{res}$ the corresponding area of each resonator. For this reason, electrical reflections are created inside the filter, which reflections degrade the transmission of the filter, and thus its performance.

SUMMARY OF THE INVENTION

In this context, the subject of the present invention is a solution allowing impedance conversion and/or mode conversion to be achieved using acoustically coupled resonators. This conversion is obtained while electrical isolation between the input and the output of the filter is ensured, the isolation itself being obtained via the propagation of acoustic waves between the resonators of the filter. According to the invention, the guiding of said waves allows better channeling of the waves to be achieved, and therefore resonators with different geometries to be used. The conversion according to the invention also allows the technological complexity of a CRF filter to be avoided, while making it possible to achieve a wider range of impedance ratios and limiting the risk of internal electrical reflections in the case of high order filters.

More specifically, the subject of the present invention is an acoustic wave bandpass filter comprising at least an input first acoustic wave resonator with an output surface, and an output second acoustic wave resonator with an input surface, said resonators being coupled to each other along a set direction, the input and output surfaces being substantially opposite, characterized in that it furthermore comprises at least one first phononic crystal structure between said input and output resonators and/or a second phonic crystal structure at the periphery of said resonators so as to guide the acoustic waves, generated by said input resonator, toward said output resonator along said set direction, the resonators ensuring an impedance conversions and/or a mode conversion.

According to one embodiment of the invention, each resonator comprises at least one layer of piezoelectric material or of electrostrictive material, and at least one electrode.

According to one embodiment of the invention, the respective input and output surfaces of said second and first resonators are perpendicular to the set direction, this embodiment being particularly advantageous for optimizing the coupling between the resonators.

According one embodiment of the invention, said output surface of said input resonator has a different dimension from that of said input surface of said output resonator.

The first and/or second phononic crystal structures make it possible to converge or diverge (and therefore guide) the acoustic waves from one surface toward the other, depending on their respective dimensions.

According to one embodiment of the invention, the filter comprises a first set of input resonators and a second set of output resonators, a first phononic crystal structure being placed between each set.

According to one embodiment of the invention, the filter comprises more than two coupled resonators, a first phononic crystal structure being placed between each pair of resonators.

According to one embodiment of the invention, the first phononic crystal structure is an acoustic lens structure, said first structure thus ensuring a guiding function and a coupling function.

According to one embodiment of the invention, the second phononic crystal structure ensures a mirror function for said acoustic waves.

According to one embodiment of the invention, the first phononic crystal structure is an acoustic wave coupling structure, the acoustic wave transmission coefficient of the second phononic crystal structure being much smaller than that of the first phononic crystal structure.

According to one embodiment of the invention, the filter comprises at least one input resonator connected to a first potential and to ground, a first output resonator connected to a second potential and to ground, and a second output resonator connected to the inverse of the second potential and to ground, so as to ensure an impedance conversion and an acoustic mode conversion between the input resonator and the output resonators.

According to one embodiment of the invention, the phononic crystal structure is located inside the layer of piezoelectric or electrostrictive material.

According to one embodiment of the invention, the phononic crystal structure comprises features on the surface of the layer of piezoelectric or electrostrictive material.

According to one embodiment of the invention, the features of the phononic structure are produced with at least one of the following materials: $SiO_2$, SiN, Mo, W, AlN.

According to one embodiment of the invention, the phononic crystal structure is one-dimensional or two-dimensional or even three-dimensional.

According to one embodiment of the invention, the piezoelectric material is a material chosen from AlN, $LiNbO_3$, ZnO, PZT and quartz, etc.

According to one embodiment of the invention, the electrostrictive material is a material chosen from $BaSrTiO_3$, $SrTiO_3$ and $BaTiO_3$.

According to one embodiment of the invention, the phononic crystal structure comprises atomic inclusions and/or diffused species.

According to one embodiment of the invention, the inclusions are obtained by implanting hydrogen atoms.

According to one embodiment of the invention, the phononic crystal structure comprises holes.

According to one embodiment of the invention, the filter comprising a plurality of first phononic crystal structures, certain of the first phononic crystal structures of the filter have acoustic wave attenuation coefficients different from the other first structures.

According to one embodiment of the invention, the resonators are bulk wave resonators.

According to one embodiment of the invention, the resonators are Lamb wave resonators and comprise an upper electrode and a lower electrode.

According to one embodiment of the invention, the resonators are surface wave resonators and comprise electrodes positioned on the surface of the piezoelectric material.

BRIEF DESCRIPTION OF THE DRAWINGS

The invention will be better understood and other advantages will appear on reading the following non-limiting description, and by virtue of the appended figures, in which.

DETAILED DESCRIPTION

To make the filter of the present invention, it is proposed to place input and output acoustic resonators such as: Lamb wave or SAW (Surface Acoustic Wave), or BAW (Bulk Acoustic Wave)—such as SMR (Solidly Mounted Resonator) or FBAR (Film Bulk Acoustic Resonator) or HBAR (High-overtone Bulk Acoustic Resonator)—resonators side by side on the same substrate.

Generally, the term "acoustic resonator" is understood to mean a resonant acoustic cavity that optionally comprises one or more electrodes. When a resonant cavity is not associated with an electrode, one or more inclusions are removed from the phononic crystal in set places in order to generate the desired acoustic waves.

In order to achieve a filter function and ensure an impedance and/or acoustic mode conversion, it is advantageously possible to couple two resonators of different sizes. The acoustic coupling thus produced does not then lead to internal electrical reflections, and, as a result, filter performance is improved. It is moreover proposed to insert a phononic crystal structure between at least one input resonator and at least one output resonator, in order to control the amount of energy exchanged between the two resonators, and therefore the bandwidth of the final component.

The impedance conversion makes it possible to provide, for example, a component having a characteristic input impedance different from the output impedance. A conventional example is a filter with an input matched to 50 ohms and an output matched to 200 ohms (these values being set by the dimensions of the input and output resonators: the area for BAW resonators or the length and the number of interdigitated combs for Lamb wave or SAW resonators).

Moreover, the mode conversion may consist in providing an input resonator, one electrode of which is referenced to ground, and the other of which is referenced to the input signal. At the output, there are thus two resonators, either acoustically out-of-phase by 180° or connected back to back, so as to generate two signals of opposite signs in the downstream circuit.

Figure 1:
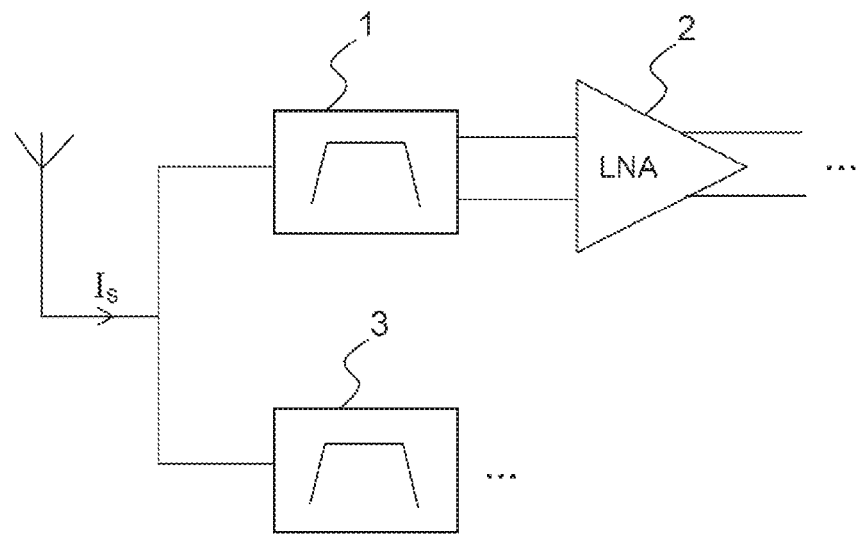
FIG. 1 illustrates a block diagram of a radiofrequency stage of a transmission or reception system.
Figure 2A:
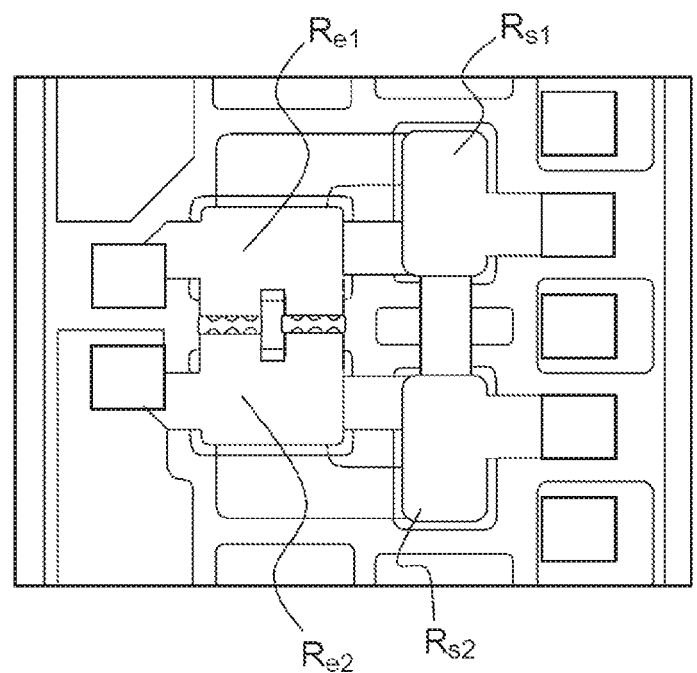
FIGS. 2a and 2b illustrate the diagram of an impedance and mode conversion filter according to the prior art, and the connection networks involved.
Figure 2B:
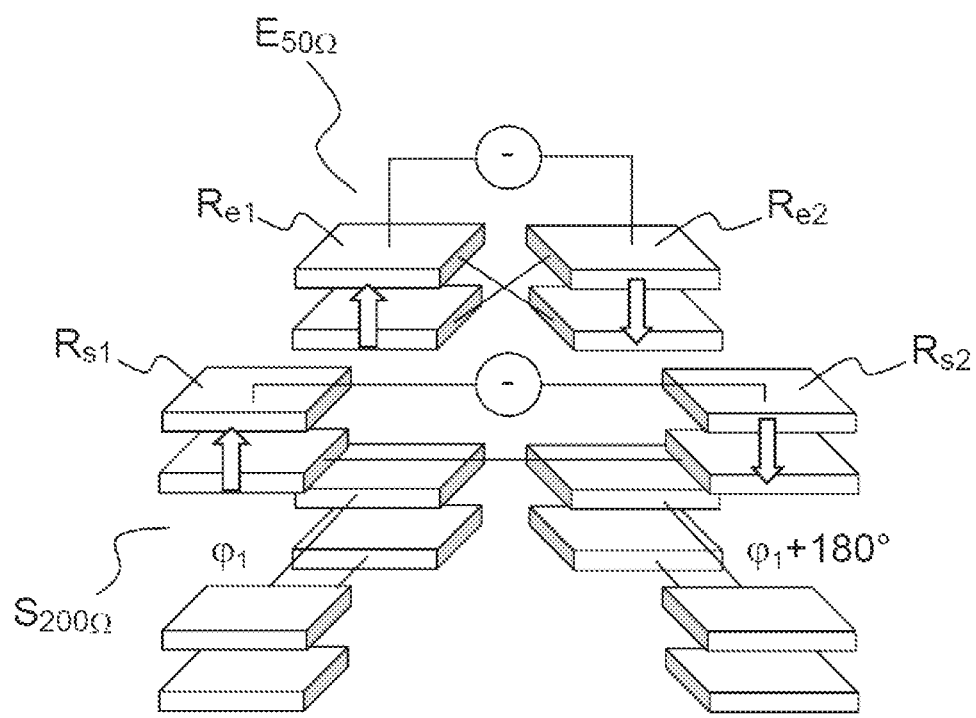
Figure 3:
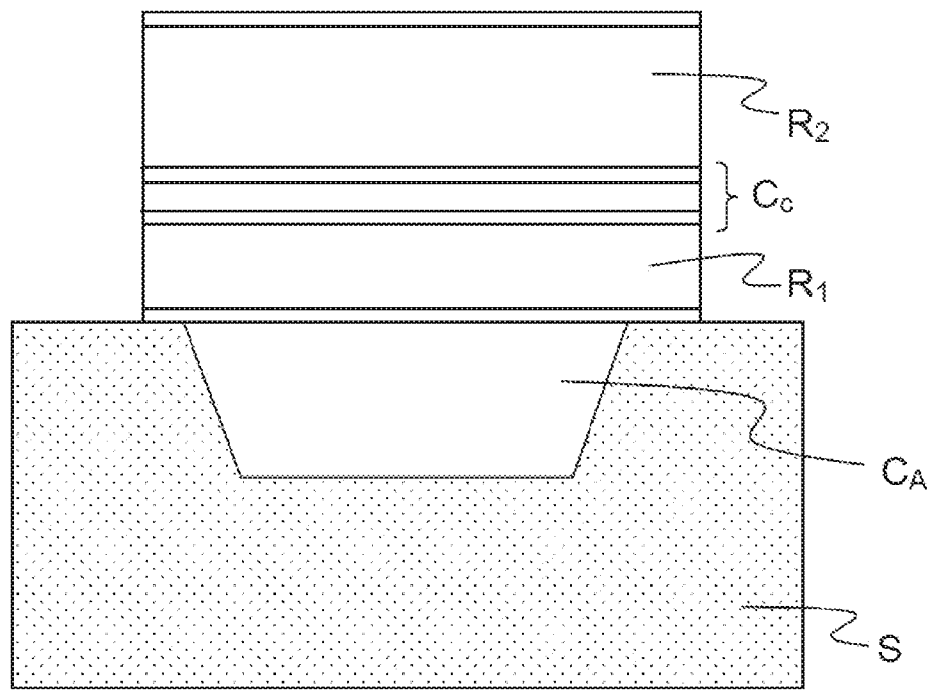
FIG. 3 illustrates an FBAR impedance conversion filter according to the prior art, using stacked resonators.
Figure 4:
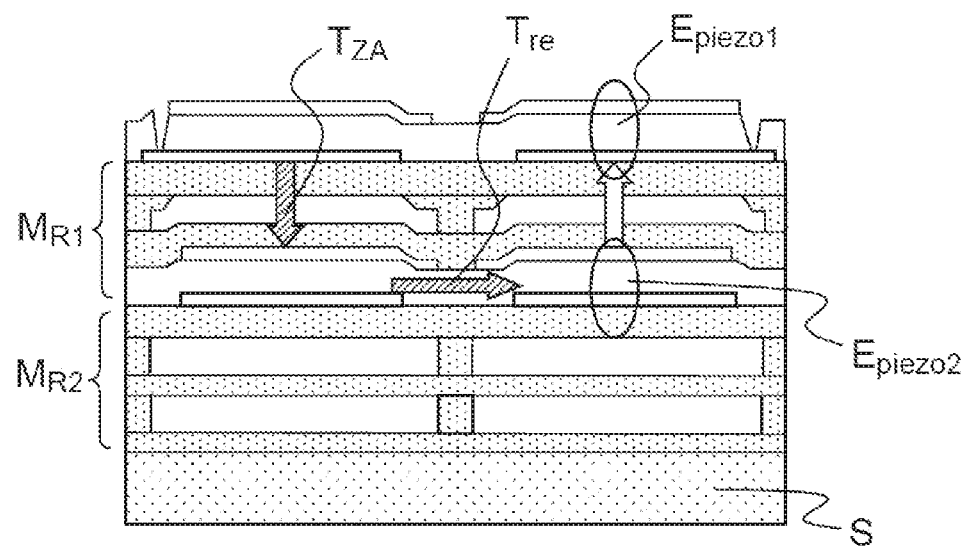
FIG. 4 illustrates a CRF impedance conversion filter according to the prior art, using four resonators.
Figure 5:
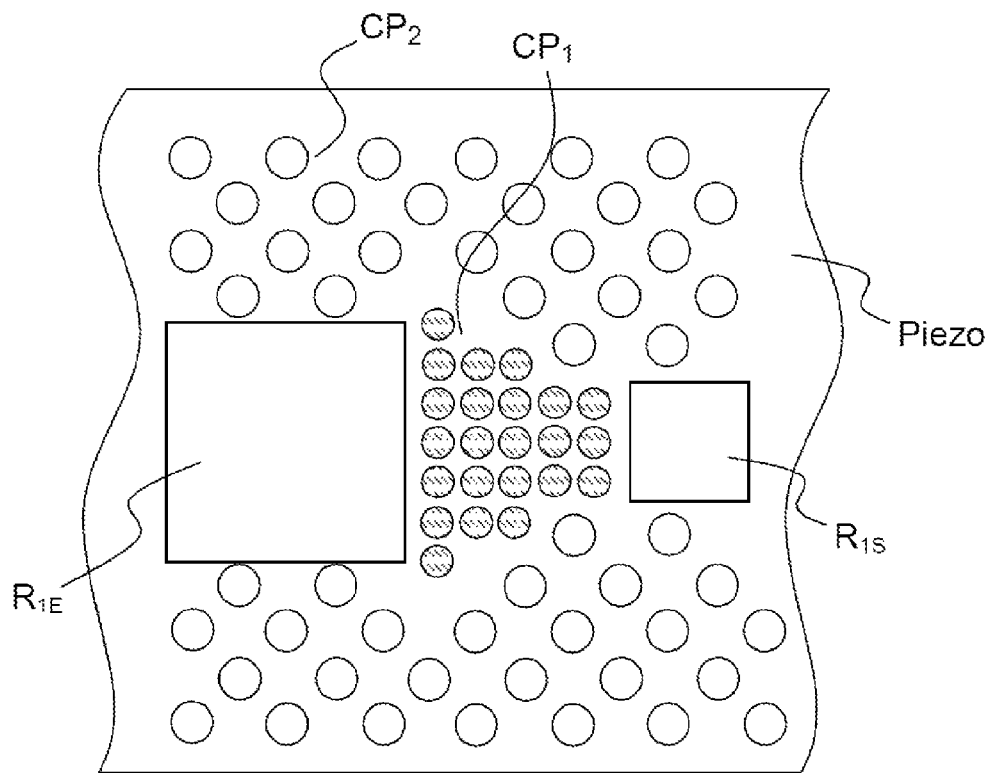
FIG. 5 illustrates a top view of an impedance conversion filter according to the invention, comprising two phononic crystal structures one of which ensures a guiding function, and the other of which ensures a coupling function.

According to a first embodiment of the invention, a phononic crystal is placed coupling the resonators together, and waves are guided using another phononic crystal designed to reflect almost all of the waves and thus confine the latter in or between the resonators, as illustrated in FIG. 5. Typically, the input resonator $R_{1E}$ and the output resonator $R_{1S}$ do not have the same dimensions and therefore the same impedances (which are dependent on their dimensions). A first phononic crystal structure $CP_1$ is incorporated between said resonators $R_{1E}$ and $R_{1S}$, in the layer of piezolectric material Piezo. A second phononic crystal structure $CP_2$ is provided at the periphery of the input and output resonators, so as to confine the acoustic waves, this second structure ensuring a mirror effect with respect to the acoustic waves. The crystal CP1 should have a transmission coefficient set by the desired bandwidth, and the phononic crystal CP2 should have the highest possible reflection coefficient.

Figure 6:
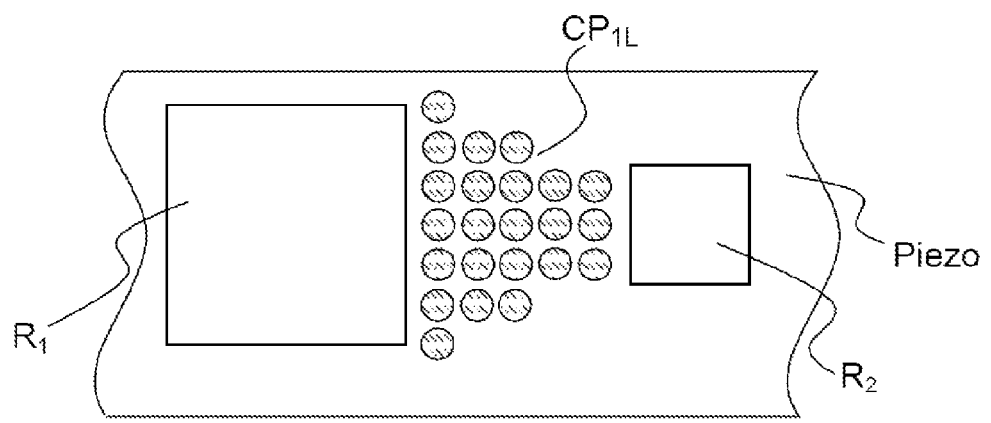
FIG. 6 illustrates a top view of an impedance conversion filter according to the invention, comprising a phononic crystal structure ensuring an acoustic lens function allowing acoustic waves to be coupled from the input resonator to the output resonator.

According to a second embodiment of the invention, it is possible to configure the first phononic crystal structure so as to provide it with a lens function with respect to the acoustic waves, such a lens structure is shown in FIG. 6, which illustrates a configuration for such a $CP_{1L}$ structure produced in the layer of piezolectric material Piezo, which no longer requires a guiding structure on either side of the two input and output resonators; such lens-effect phononic crystal configurations are notably described in the following articles: A. C. Hladky-Hennion, J. Vasseur, B. Dubus, B. Djafari-Rouhani, D. Ekeom and B. Morvan, *Numerical analysis of negative refraction of transverse waves in an elastic material*, Journal of Applied Physics, 104, n° 064906, 2008, M. H. Lu, L. Feng and Y. F. Chen, *Phononic crystals and acoustic metamaterials*, Materials Today, 12, 12, pp. 34-42, 2009.

Figure 7:
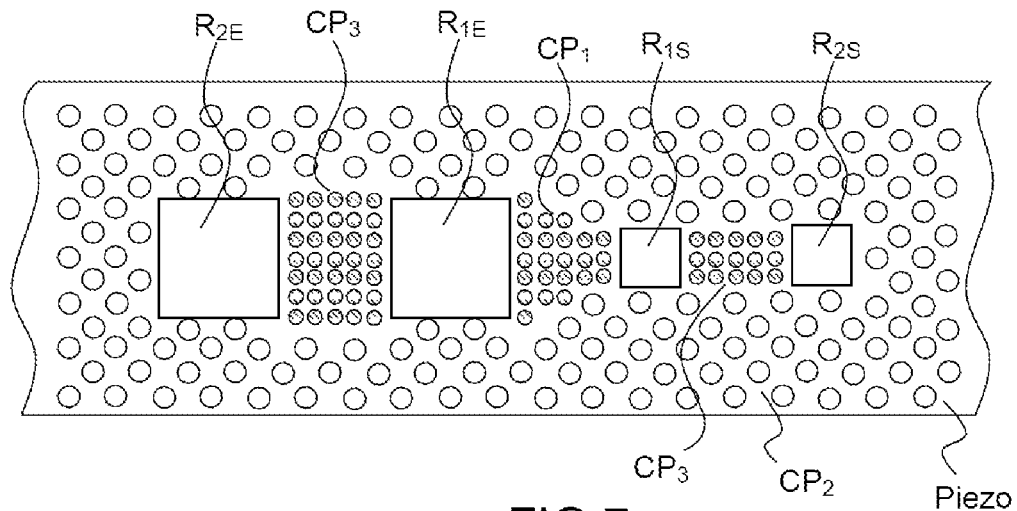
FIG. 7 illustrates a top view of an impedance conversion filter according to the invention, comprising a plurality of input and output resonators, and a plurality of phononic crystal structures.

According to a third embodiment of the invention, the filter may advantageously comprise coupled resonators. The addition of supplementary resonators improves the selectivity of the filter. FIG. 7 illustrates in this regard a configuration comprising two first resonators $R_{1E}$ and $R_{2E}$, and two second resonators $R_{1S}$ and $R_{2S}$, each resonator being separated from an adjacent resonator by a phononic crystal structure: a first conversion structure $CP_1$ between the two resonators $R_{1E}$ and $R_{1S}$, and a second guiding phononic crystal structure $CP_2$ and third phononic crystal structures $CP_3$ for improving the selectivity of the filter.

Figure 8:
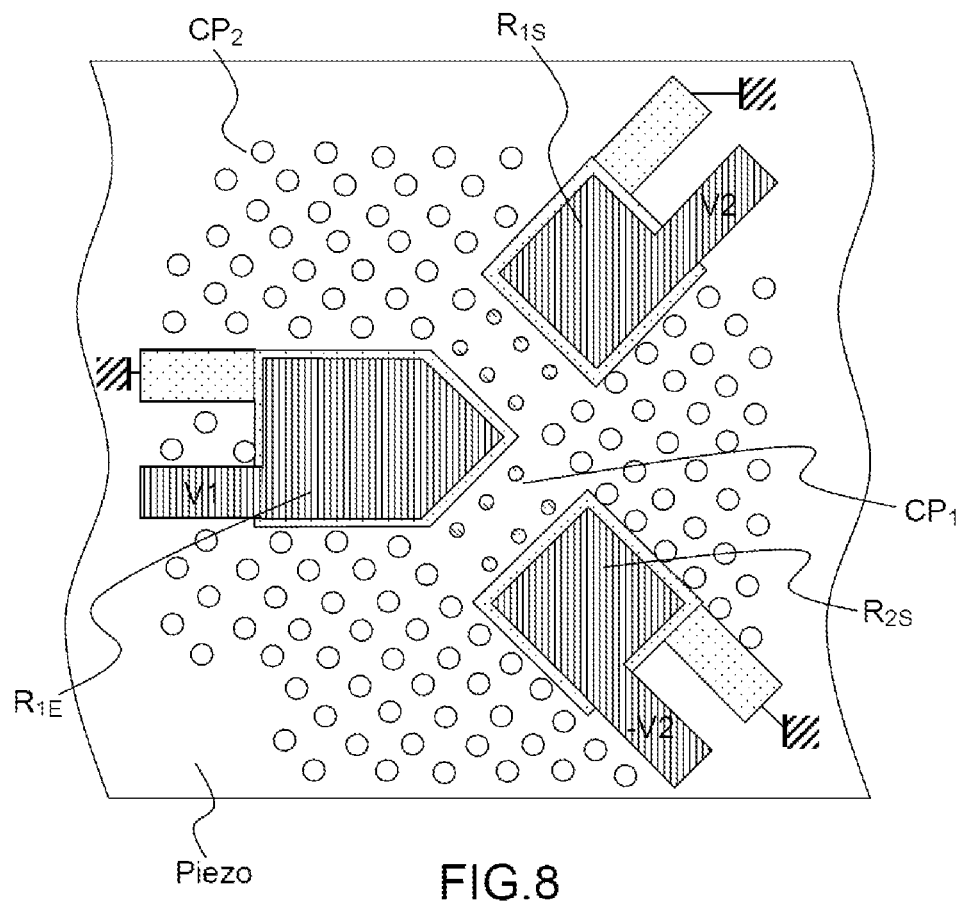
FIG. 8 illustrates a top view of an impedance and mode conversion filter according to the invention, comprising an input resonator and two output resonators toward which the acoustic waves are guided.

The present invention makes it possible to envision simultaneous impedance and mode conversion since it is possible to guide the waves toward two resonators rather that to only one. Depending upon the technology used, it is also possible to electrically connect the two output resonators, either directly or via an inverter, as shown more specifically in FIG. 8, which shows the potentials to which the input and output resonators are connected. An input resonator $R_{1E}$ is provided connected on the one hand to a potential V1 and on the other hand to ground. At the output, according to this embodiment, a first output resonator $R_{1S}$ and a second output resonator $R_{2S}$ are provided, the first output resonator being connected to ground and to a second potential V2, the second output resonator being differentially connected to ground and to a potential −V2. Advantageously, the geometries of the resonators are set in order to better direct the lateral waves in the direction of the output resonators.

It will be recalled that the present invention can be applied to both bulk wave resonators and Lamb wave resonators, and to surface wave resonators, as well. For this reason examples of embodiments are given hereafter.

Figure 9:
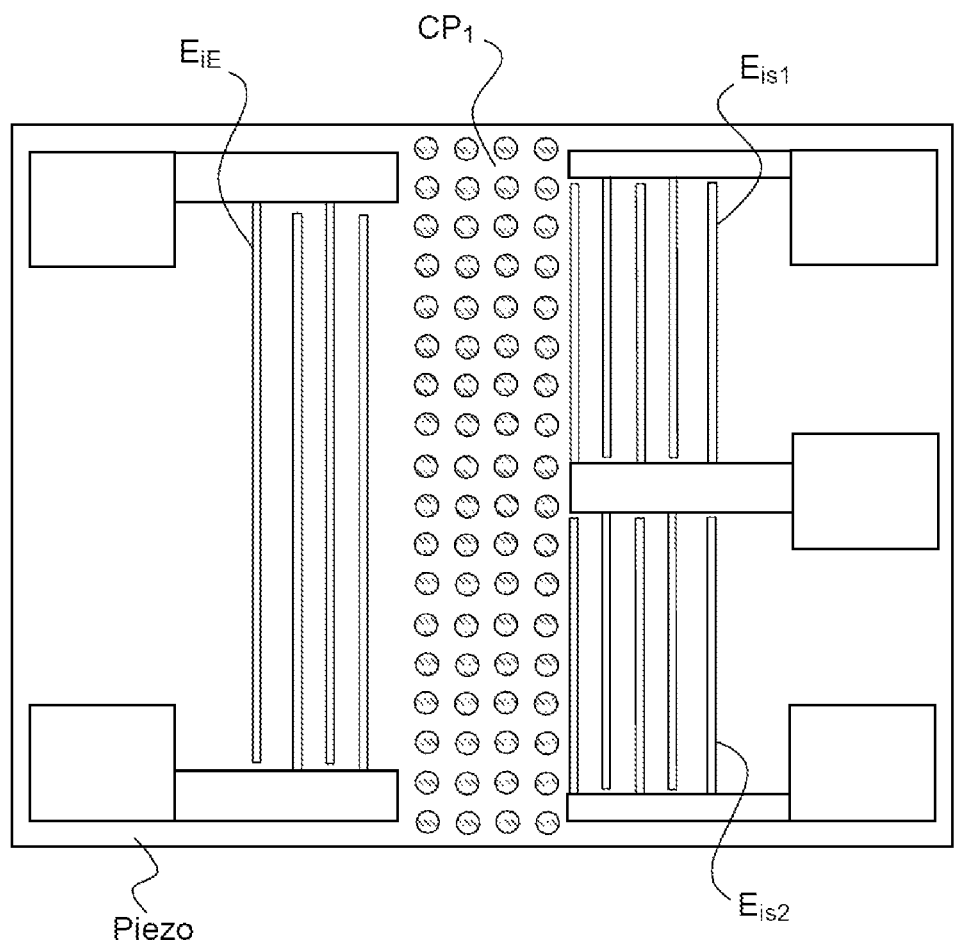
FIG. 9 illustrates an embodiment of the invention using surface wave resonators (less advantageous embodiment)

In the context of surface wave resonators and in the context of the previously described second embodiment of the invention, FIG. 9 illustrates a surface wave resonator configuration showing a first series of interdigitated electrodes $E_{iE}$ defining the input surface wave resonator, and two series of interdigitated electrodes $E_{iS1}$ and $E_{iS2}$ definining two output surface wave resonators. The input resonator is separated from the output resonators by a first phononic crystal structure $CP_1$.

It will be recalled that whatever the embodiment of the invention, it is possible to use, indifferently, one-, two-, or three-dimensional phononic crystals provided the first phononic crystal structure used fulfills its mirror or acoustic lens function.

The present invention thus makes it possible to achieve the impedance conversion without the mode conversion. It also takes up less space (and probably introduces fewer losses) than the balun technique (electrical coupling). Compared with CRFs, the manufacturing technology is much simpler. Indeed, such devices can be manufactured with just four mask levels.

It should be noted that in the context of the present invention, and in contrast to the prior art, it is notably proposed to use variations in resonator areas rather than variations in thicknesses, areas being, as a parameter, easier to control.

Examples of embodiments of filters according to the present invention are described below.

FIRST EXAMPLE OF A FILTER ACCORDING TO THE INVENTION

Figure 10:
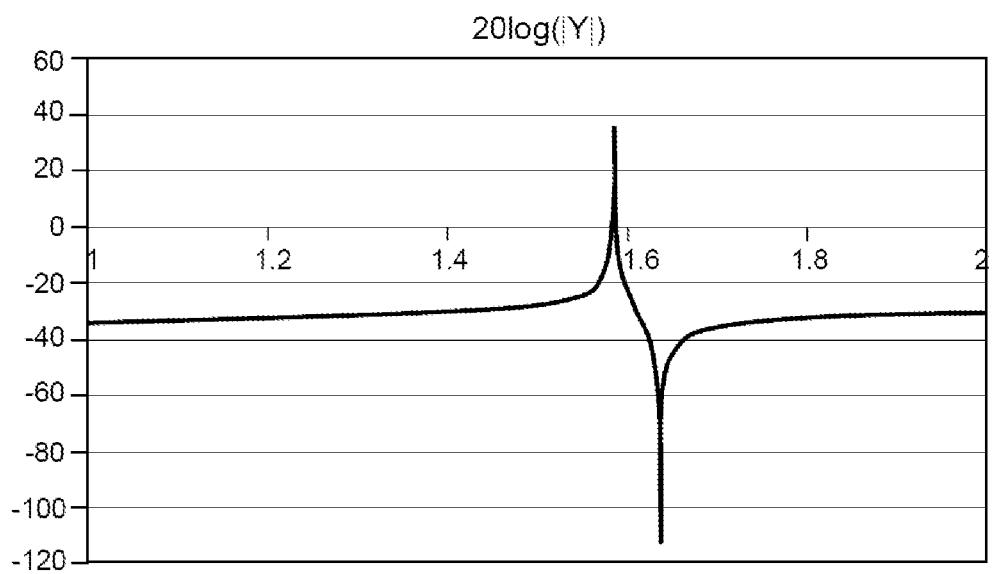
FIG. 10 illustrates the admittance of BAW filters used in one filter of the invention.

According to this example, the filter comprises BAW resonators formed from a 2 μm layer of aluminum nitride (AlN) between two molybdenum (Mo) electrodes each having a thickness of 200 nm. This AlN layer is suspended on top of a conventional silicon substrate making it possible, more precisely, to produce FBAR (Film Bulk Acoustic Resonator) resonators. FIG. 10 illustrates the admittance of such resonators, calculated from a 1 D-model based on Mason's equations, showing a resonance around 1.6 GHz.

To obtain an impedance of 50Ω for the input resonator, and of 100Ω for the output resonators, the resonator areas can be calculated using the following equation:

$$Z = \frac{1}{C\omega}$$

With:
Z the impedance of the resonator
C the capacitance of the resonator
ω the resonant angular frequency of the resonator
In addition, it is known that:

$$\omega = 2\pi f \text{ and } C = \frac{\varepsilon S}{e}$$

Figure 11A:
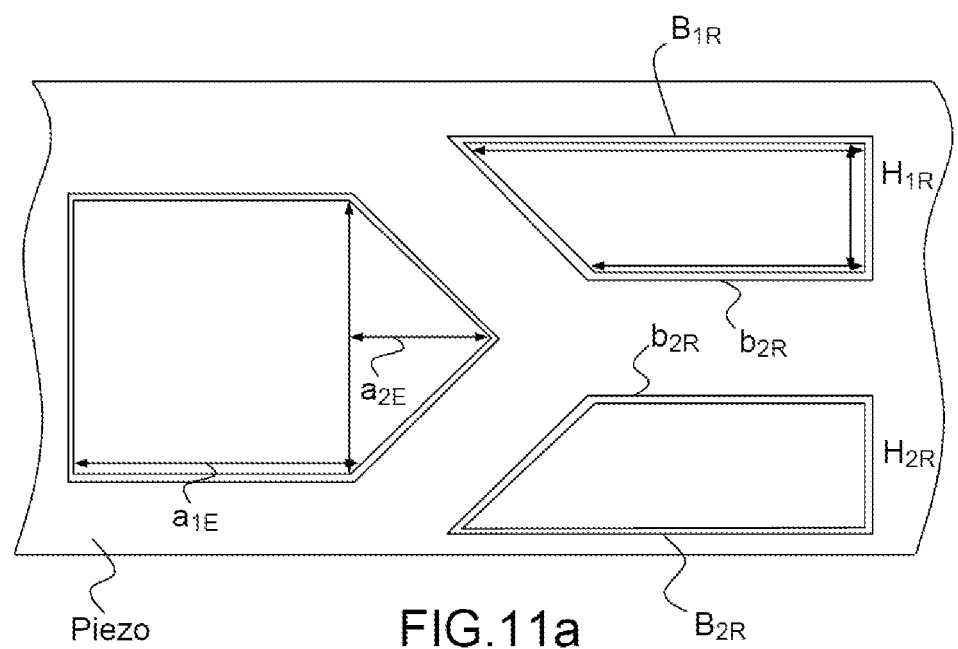
FIGS. 11a, 11b and 11c illustrate examples of resonator configurations and phononic crystal structures that can be used in an example of a filter according to the invention.

With:
f the resonant frequency (in the present case 1.6 GHz)
∈ the permittivity of the material (meaning, in the present case, that of AlN, $8.26 \times 10^{-8}$)
S the area of the resonator
e the thickness of the piezoelectric layer (here 2 μm)
To obtain a 50Ω impedance, a capacitance of C=2 pF is recommended and therefore an area of S=48,600 μm². Likewise, to obtain a 100Ω impedance, it is sought to obtain the same characteristics divided by 2, meaning a capacity of C=1 pF and an area of S=24,300 μm². FIG. 11a illustrates an example of a configuration for obtaining these physical parameters, with the following dimensions:
for the input resonators: the following side lengths: $a_{1E}$=180 μm and $a_{2E}$=90 μm;
for the output resonators: the following side lengths:

$B_{1R}=B_{2R}$=270 μm, $b_{1R}=b_{2R}$=180 μm and $H_{1R}=H_{2R}$=90 μm.

Figure 11B:
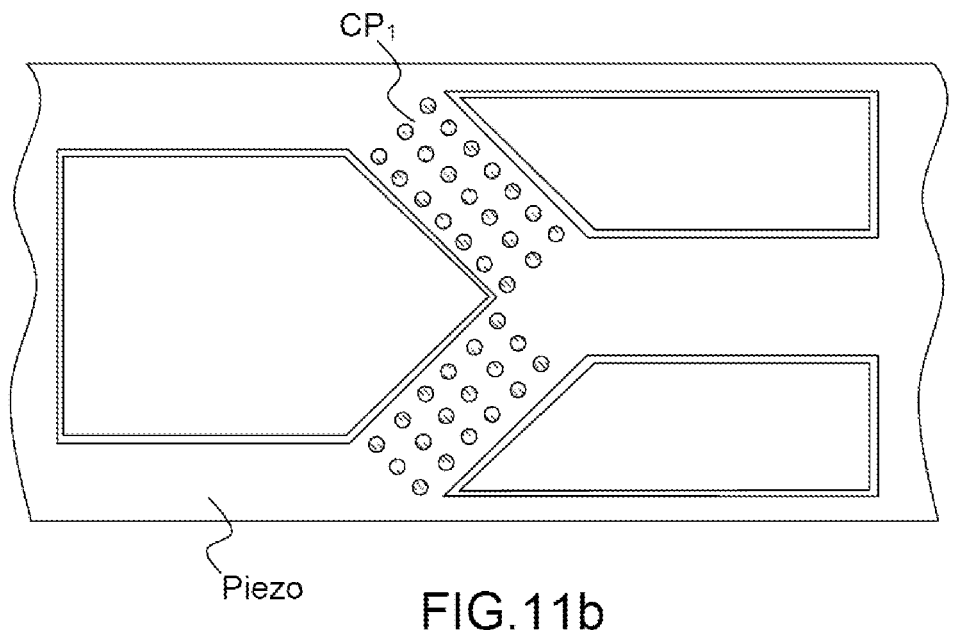

To produce the phononic crystal structure $CP_1$ as illustrated in FIG. 11b, a structure comprising cylindrical holes can be produced in an AlN membrane. The holes are organized in a square mesh with a mesh parameter a=2.22 μm, and the diameter of the holes is: d=1.28 μm, the AlN thickness being 2 μm.

In this case, the phononic crystal has a stop-band between 1.57 and 1.64 GHz.

Figure 11C:
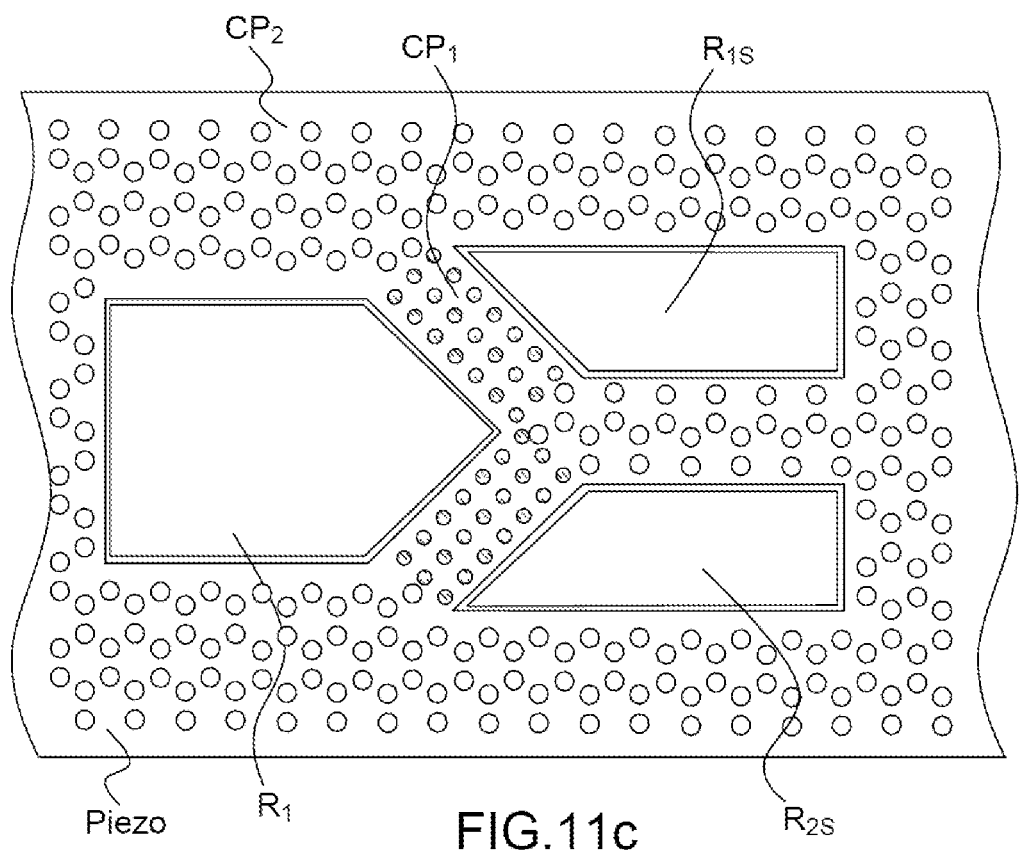

Advantageously, this filter may comprise a second phononic crystal structure $CP_2$, as illustrated in FIG. 11c, in order to obtain better reflection around the input and output resonators to prevent losses. This second structure can notably be produced by providing cylindrical holes in the AlN, with a hexagonal honeycomb organization. With a mesh parameter of 1.43 μm and a radius of 0.69 μm, while preserving a thickness of 2 μm, a stop-band between 1.34 and 1.83 GHz is achieved.

It is equally possible, with this exemplary filter, to achieve mode conversion by making electrical connections between the lower and upper electrodes of the two right-hand side resonators.

FIRST EXAMPLE OF A METHOD FOR FABRICATION THE FILTER ACCORDING TO THE INVENTION

This first example is a filter formed from SMR (Solidly Mounted Resonators) resonators on a Bragg mirror, these resonators being coupled by an acoustic lens consisting of a two-dimensional phononic crystal formed by silica pads placed in the space between the resonators on the piezoelectric layer. The silica pads could also be placed under and, advantageously, on and under the piezoelectric layer.

Figure 12A:
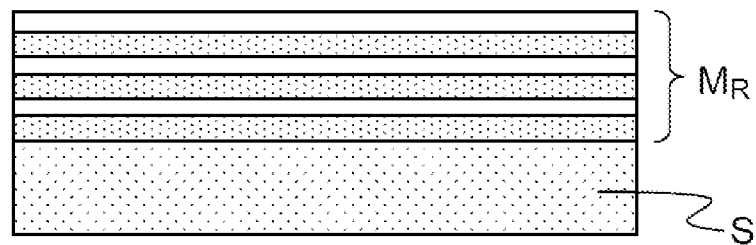
FIGS. 12a, 12b, 12c, 12d, and 12e illustrate cross-sectional and top views of the various steps of a process for producing a first example according to the invention.

As illustrated in FIG. 12a, starting with a silicon substrate S, an operation for thermally oxidizing said $SiO_2$ substrate is carried out on a thickness of 1 μm, then deposited the following are in succession:
silicon nitride (SiN) over a thickness of 0.8 μm;
silicon oxycarbide or porous oxysilicon (SiOC) over a thickness of about 1 μm;
SiN over a thickness of about 0.5 μm;
SiOC over a thickness of about 1 μm;
SiN over a thickness of about 0.5 μm; and
$SiO_2$ over a thickness of about 0.6 μm so as to define a Bragg mirror structure MR.

Figure 12B:
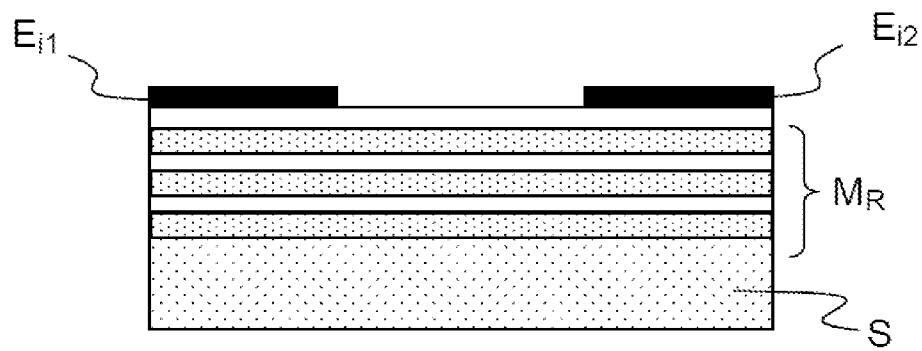

FIG. 12b illustrates the formation of the two lower electrodes $E_{i1}$ and $E_{i2}$ by depositing a molybdenum Mo layer over a thickness of 0.3 μm, then using lithography, etching and resist removal called "stripping".

Figure 12C:
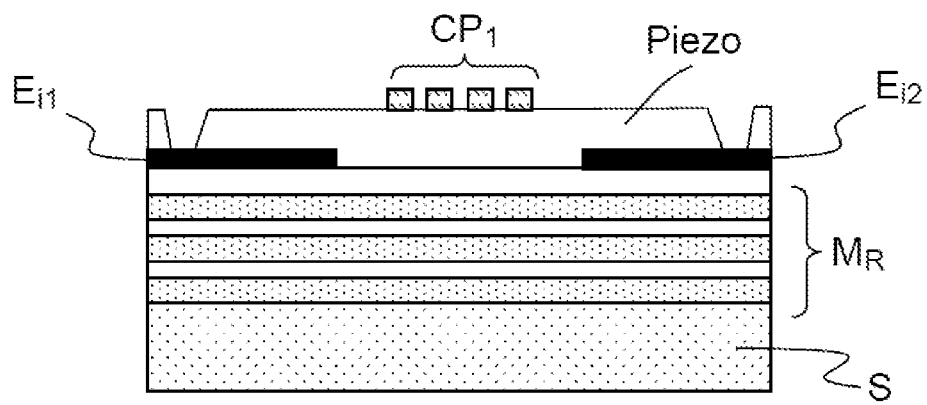

FIG. 12c illustrates the formation of the phononic crystal at the surface of the piezoelectric material $P_{iézo}$, due to the following successive operations:
deposition of the layer of piezoelectric material $P_{iézo}$ in AlN over a thickness of 1.7 μm;
deposition of an $SiO_2$ layer with a thickness of about 0.5 μm making it possible to produce the phononic crystal $CP_1$, followed by a step of lithography, etching and local removal of the $SiO_2$ layer;
etching and local removal of the AlN layer to open vias.

Figure 12D:
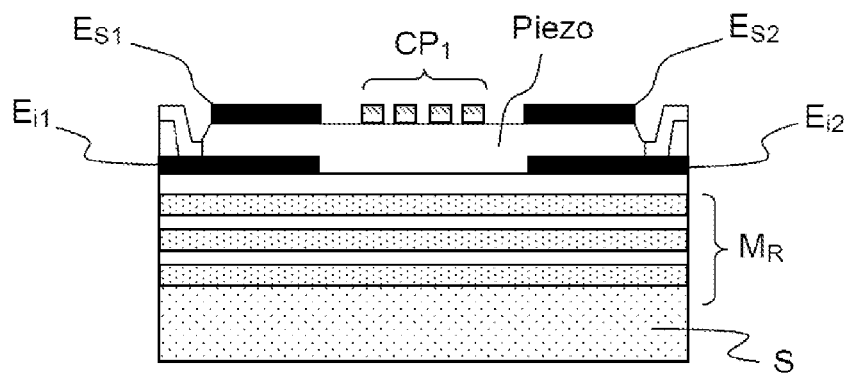

FIG. 12d illustrates the formation of the upper electrodes $E_{s1}$ and $E_{s2}$ by depositing a molybdenum Mo layer over a thickness of 0.3 μm, then using lithography, etching and "stripping".

It is thus necessary to have four mask levels. The phononic crystal could thus consist of molybdenum contacts to avoid a few technological steps, but it is then necessary to make sure that there is no electrical coupling between the metal pads and the resonators.

Figure 12E:
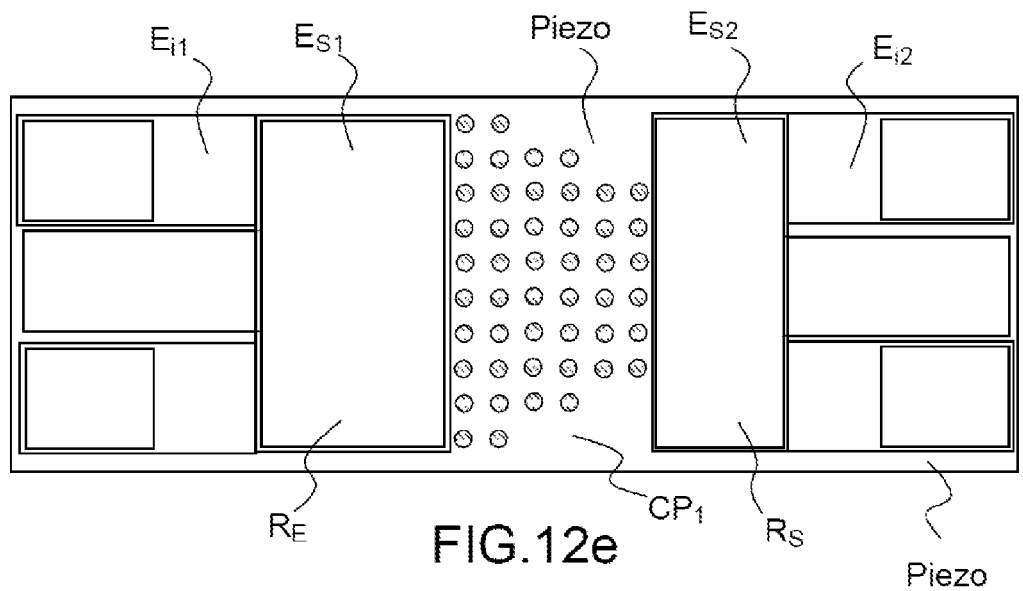

FIG. 12e illustrates a top view of this exemplary filter, the electrodes $E_{i1}$ and $E_{S1}$ defining an input resonator $R_E$, and the electrodes $E_{i2}$ and $E_{s2}$ defining an output resonator $R_S$.

One variant of the first example consists in achieving the impedance conversion by acting at the same time on the area and the thickness of the resonators so as to limit their footprint. For example, by reducing the thickness of the piezoelectric layer, the area required to achieve a given impedance would be smaller, which would lead to the minimization of the area occupied by the component. This reduction can be achieved by inserting steps of lithography, etching of the AlN, and "stripping" between the deposition of the AlN and the etching of the accesses to the lower electrode.

SECOND EXAMPLE OF A METHOD FOR FABRICATION THE FILTER ACCORDING TO THE INVENTION

In this example, the filter allows the impedance and mode conversion to be achieved, with a cross-connected output. The resonators are coupled via a two-dimensional phononic crystal consisting of cylindrical air inclusions (holes) in an aluminum nitride (AlN) membrane, and produced according to the method developed by G. Piazza and his team: N. K. Kuo, C. J. Zuo, G. Piazza, *Demonstration of Inverse Acoustic Band Gap Structures in AlN and Integration with Piezoelectric Contour Mode Wideband Transducers*, 2009 Solid-State Sensors, Actuators and Microsystems symposium, pp. 10-13, 2009, N. Sinha, R. Mahameed, C. Zuo, M. B. Pisani, C. R. Perez and G. Piazza, *Dual-beam actuation of piezoelectric AlN RF MEMS switches monolithically integrated with AlN contour-mode resonators*, Solid-State Sensors, Actuators and Microsystems Workshop, Hilton Head Island, pp. 22-25, Jun. 1-5, 2008.

Figure 13A:
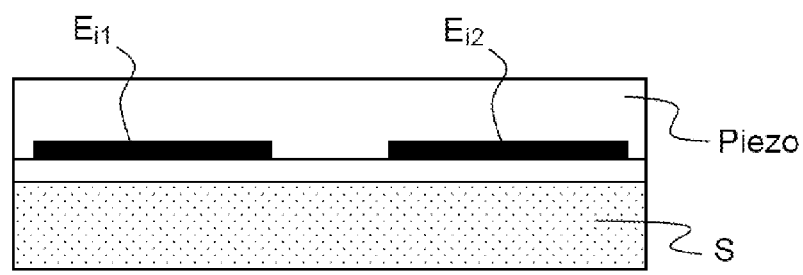
FIGS. 13a, 13b, 13c, 13d, 13e and 13f illustrate cross-sectional and top views of the various steps of a process for producing a second example according to the invention.

As illustrated in FIG. 13a, starting with a silicon substrate S, typically with a thickness of about 700 μm, a "Low Strees Nitride" (LSN) deposit with a thickness of the order of 300 nm, is produced. A deposit of platinum metal with a thickness of 200 nm is produced on the surface, and using lithograph and a lift-off method, the geometry of the lower electrodes $E_{i1}$ and $E_{i2}$ of the resonators are defined. The layer of piezoelectric material $P_{iezo}$ of aluminum nitride is then deposited with a thickness of about 2 μm.

Figure 13B:
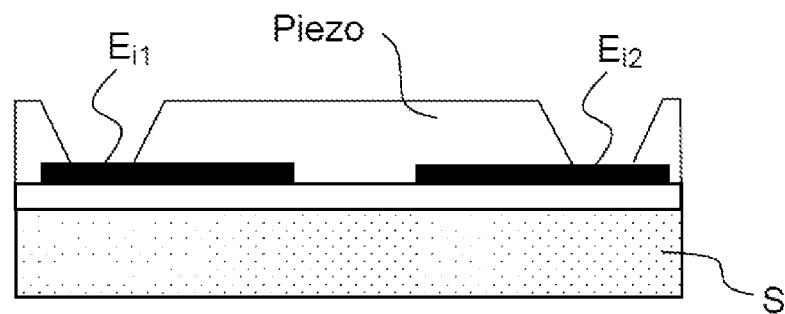

A wet etching operation of the layer of piezoelectric material AlN is then carried out, using KOH in order to define the accesses to the lower electrodes, as illustrated in FIG. 13b.

Figure 13C:
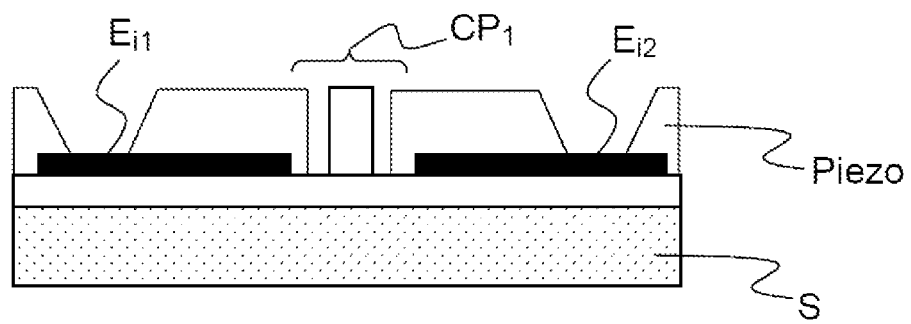

The phononic crystal structures are then produced by dry etching of the AlN as shown in FIG. 13c.

Figure 13D:
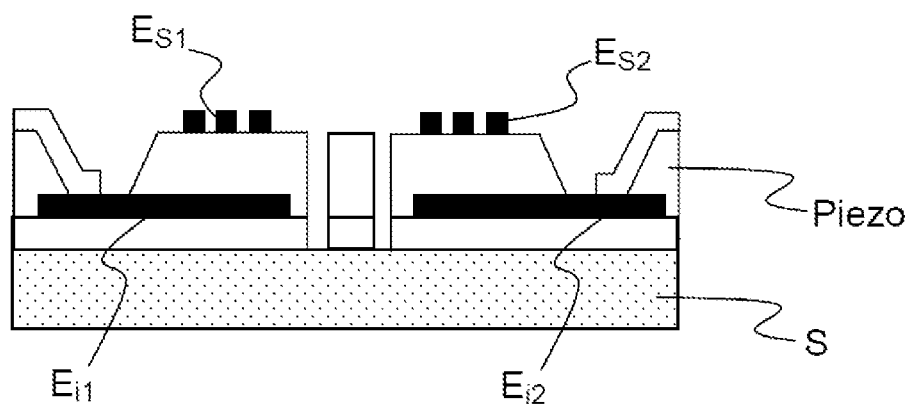

The upper electrodes $E_{S1}$ and $E_{S2}$ are then produced as shown in FIG. 13d via the deposition of a platinum layer with a thickness of about 200 nm, a lithography method and lift-off method.

Figure 13E:
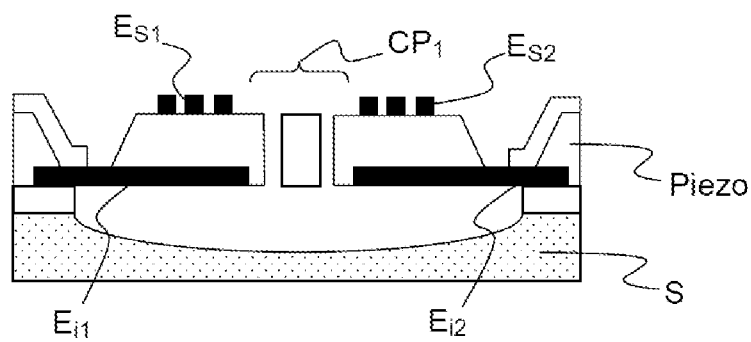

Finally, the freeing of the membrane is carried out in order to define the FBAR resonators, using a xenon difluoride ($XeF_2$) etch, as shown in FIG. 13e.

Figure 13F:
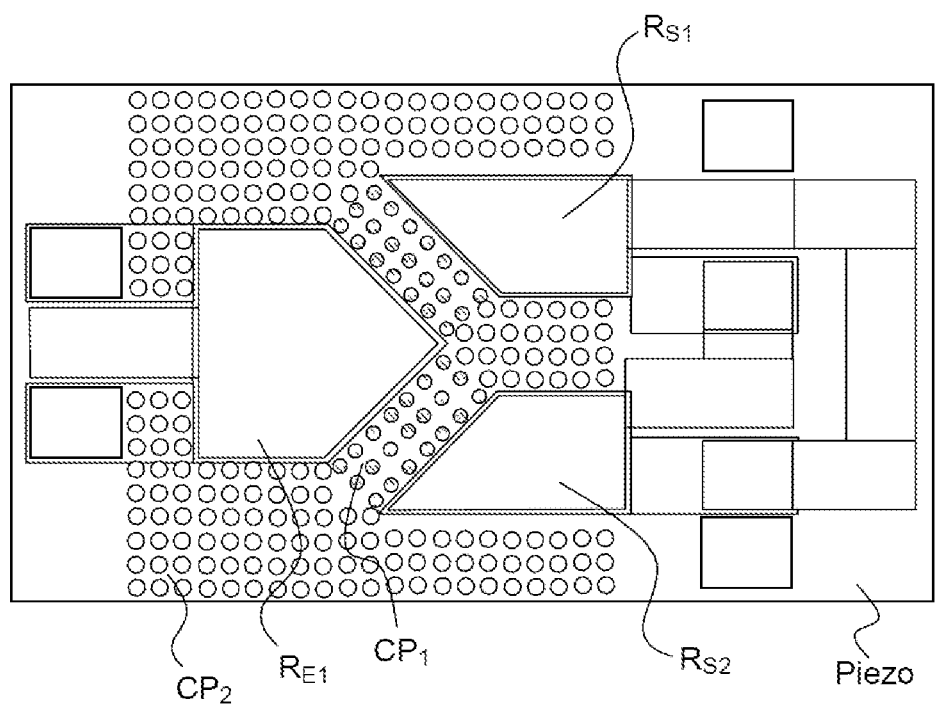

FIG. 13f illustrates a top view of the filter thus produced, and of the resonator structures defined by the geometry of the electrodes: an input resonator $R_{E1}$ and two output resonators $R_{S1}$ and $R_{S2}$.

THIRD EXAMPLE OF A METHOD FOR FABRICATION THE FILTER ACCORDING TO THE INVENTION

The third example is an impedance conversion filter consisting of FBAR resonators produced on a thin zinc oxide (ZnO) film. Wave propagation is achieved through a silicon membrane. The phononic crystals consist of air holes in the silicon membrane. The method is based of the method for producing phononic crystals, developed by Mohammadi: S. Mohammadi, A. A. Eftekhar, A. Adibi, US patent 2009/0295505 A1, December 2009.

Figure 14A:
FIGS. 14a, 14b, 14c, 14d, 14e, and 14f illustrate cross-sectional and top views of the various steps of a third example according to the invention.

In a first step, starting with an SOI (Silicon-On-Insulator) substrate consisting of a silicon substrate S comprising a $SiO_2$ layer $S_0$; buried and therefore covered by a silicon layer S', with a Si thickness of 15 μm, and a gold layer Mi with a thickness of 100 nm is deposited and the lower electrodes of the resonators are defined in this layer via lithography, as shown in FIG. 14a.

Figure 14B:
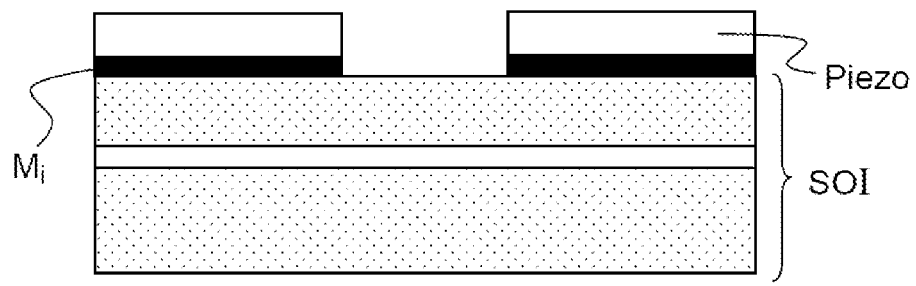

During a second step, the deposition of a layer of piezoelectric material $P_{iézo}$ of ZnO with one micron thickness, is carried out, in which features are defined, as illustrated in FIG. 14b, via lithography, etching and "stripping".

Figure 14C:
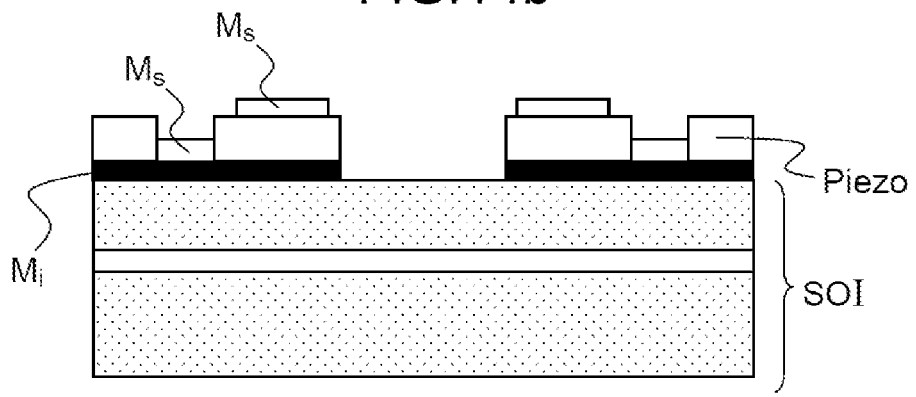

During a third step, a second metalization layer, $M_S$, of aluminum with a 200 nm thickness, is deposited, and the features of the upper electrodes are defined via lithography, as illustrated in FIG. 14c.

Figure 14D:
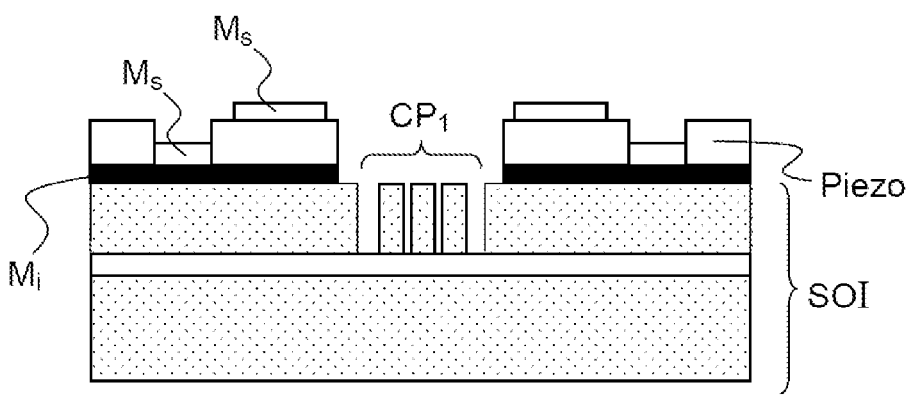

The phononic crystal structures $CP_1$ and $CP_2$ are produced within the silicon via lithography, etching and stripping, as illustrated in FIG. 14d.

Figure 14E:
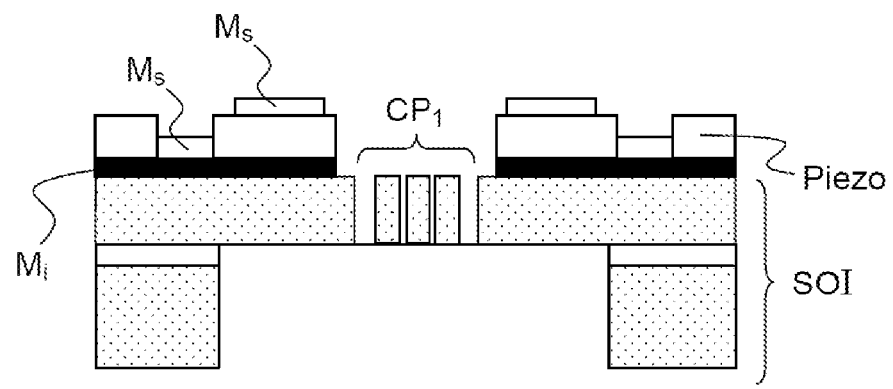

Finally, the back side of the membrane is freed in order to produce an FBAR filter, via an etching method which could advantageously be DRIE etching "Deep Reactive Ionic Etching", as illustrated in FIG. 14e.

Figure 14F:
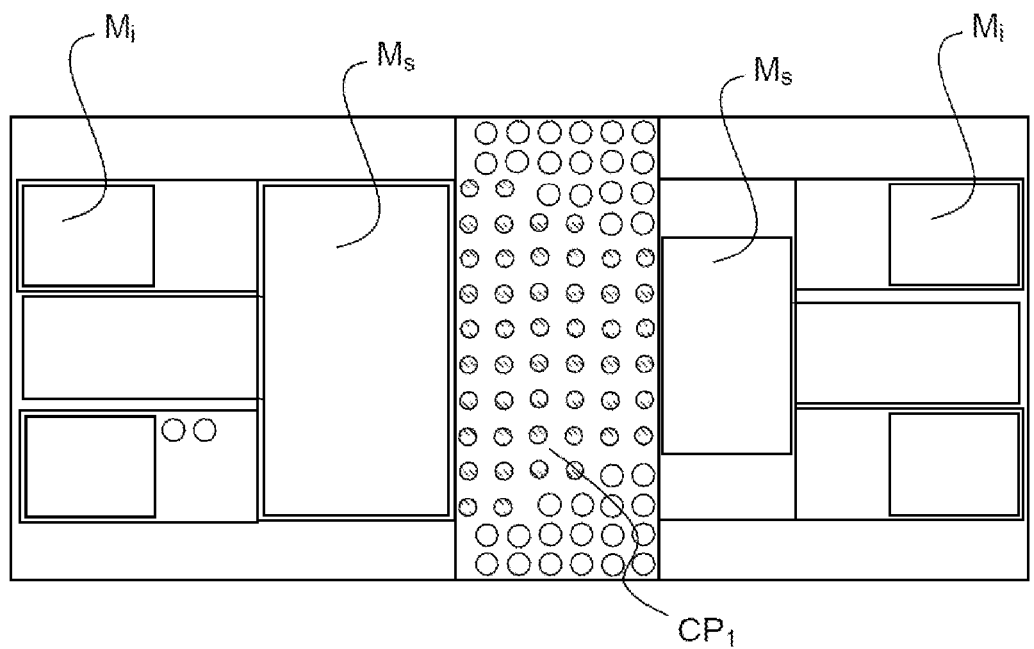

FIG. 14f illustrates a top view of such an FBAR filter, showing the different phononic crystal structures $CP_1$ and $CP_2$, produced during the previous step.

The invention claimed is:

1. An acoustic wave bandpass filter comprising:
   an input acoustic wave resonator with an output surface;
   a first output acoustic wave resonator with an input surface, the first output acoustic wave resonator being coupled to the input acoustic wave resonator along a set direction; and
   at least one first phononic crystal structure between the input acoustic wave resonator and the first output acoustic wave resonator; and
   a second phononic crystal structure at the periphery of the input acoustic wave resonator and the output acoustic wave resonator so as to guide acoustic waves generated by the input acoustic wave resonator toward the first output acoustic wave resonator along the set direction, and
   wherein the input surface is substantially opposite to the output surface,
   wherein the acoustic waves are guided along the set direction and the input acoustic wave resonator and the first output acoustic wave resonator ensure at least one of a mode conversion and an impedance conversion.

2. The acoustic wave bandpass filter as claimed in claim 1, wherein each of the input acoustic wave resonator and the first output acoustic wave resonator includes at least one electrode and at least one of a layer of piezoelectric material and a layer of electrostrictive material.

3. The acoustic wave bandpass filter as claimed in claim 2, wherein at least one of the at least one first phononic crystal structure and the second phononic crystal structure is located inside the at least one of the layer of piezoelectric and the layer of electrostrictive material.

4. The acoustic wave bandpass filter as claimed in claim 2, wherein at least one of the at least one first phononic crystal structure and the second phononic crystal structure includes features on a surface of the at least one of the layer of piezoelectric material and the layer of electrostrictive material.

5. The acoustic wave bandpass filter as claimed in claim 4, wherein the features on the surface are produced with at least one of the following materials: $SiO_2$, SiN, Mo, W, AlN.

6. The acoustic wave bandpass filter as claimed in claim 2,
wherein at least one of the input acoustic wave resonator and the first output acoustic wave resonator includes the layer of piezoelectric material, and
wherein the piezoelectric material is a material chosen from AN, $LiNbO_3$, ZnO, PZT and quartz.

7. The acoustic wave bandpass filter as claimed in claim 2,
wherein at least one of the input acoustic wave resonator and the first output acoustic wave resonator includes the layer of electrostrictive material, and
wherein the electrostrictive material is a material chosen from $BaSrTiO_3$, $SrTiO_3$ and $BaTiO_3$.

8. The acoustic wave bandpass filter as claimed in claim 1,
wherein the second phononic crystal structure ensures a mirror function for the acoustic waves.

9. The acoustic wave bandpass filter as claimed in claim 1,
wherein the at least one first phononic crystal structure is an acoustic wave coupling structure, and
wherein an acoustic wave transmission coefficient of the second phononic crystal structures is smaller than an acoustic wave transmission coefficient of the at least one first phononic crystal structure.

10. The acoustic wave bandpass filter as claimed in claim 1,
further comprising a second output acoustic wave resonator,
wherein the input acoustic wave resonator is connected to a first potential and to ground,
wherein the first output acoustic wave resonator is connected to a second potential and to ground, and
wherein the second output acoustic wave resonator is connected to an inverse of the second potential and to ground to facilitate the mode conversion and the impedance conversion between the input acoustic wave resonator and the first output acoustic wave resonator and the second output acoustic wave resonator.

11. The acoustic wave bandpass filter as claimed in claim 1, wherein the input surface and the output surface are perpendicular to the set direction.

12. The acoustic wave bandpass filter as claimed in claim 1, wherein the output surface has a dimension different from a dimension of the input surface.

13. The acoustic wave bandpass filter as claimed in claim 1,
further comprising a first set of input acoustic wave resonators including the input acoustic wave resonator and a second set of output acoustic wave resonators including the first output acoustic wave resonator, and
wherein the at least one first phononic crystal structure is placed between the first set of input acoustic wave resonators and the second set of output acoustic wave resonators.

14. The acoustic wave bandpass filter as claimed in claim 1, wherein each of the at least one first phononic crystal structure and the second phononic crystal structure is one of one-dimensional, two-dimensional, and three-dimensional.

15. The acoustic wave bandpass filter as claimed in claim further comprising:
a plurality of pairs of the input acoustic wave resonator and the first output acoustic wave resonator, and
the at least one first phononic crystal structure includes a phononic crystal structure placed between each pair of the input acoustic wave resonator and the first output acoustic wave resonator.

16. The acoustic wave bandpass filter as claimed in claim 1, wherein the at least one first phononic crystal structure is an acoustic lens structure.

17. The acoustic wave bandpass filter as claimed in claim 1, wherein at least one of the at least one first phononic crystal structure and the second phononic crystal structure includes atomic inclusions and/or diffused species.

18. The acoustic wave bandpass filter as claimed in claim 17, wherein the inclusions are obtained by implanting hydrogen atoms.

19. The acoustic wave bandpass filter as claimed in claim 1, wherein at least one of the at least one first phononic crystal structure and the second phononic crystal structure includes holes.

20. The acoustic wave bandpass filter as claimed in claim 1,
wherein the at least one phononic crystal structure includes a plurality of first phononic crystal structures, and
wherein certain first phononic crystal structures of the plurality of first phononic crystal structures have acoustic wave attenuation coefficients that are different from acoustic wave attenuation coefficients of other first phononic crystal structures of the plurality of first phononic crystal structures.

21. The acoustic wave bandpass filter as claimed in claim 1, wherein each of the input acoustic wave resonator and the first output acoustic wave resonator is a bulk wave resonator.

22. The acoustic wave bandpass filter as claimed in claim 1, wherein each of the input acoustic wave resonator and the first output acoustic wave resonator is a Lamb wave resonator including an upper electrode and a lower electrode.

23. The acoustic wave bandpass filter as claimed in claim 1, wherein each of the input acoustic wave resonator and the first output acoustic wave resonator is a surface wave resonator including electrodes positioned on a surface formed of a piezoelectric material.

24. An acoustic wave bandpass filter comprising:
an input acoustic wave resonator with an output surface;
an output acoustic wave resonator with an input surface, the output acoustic wave resonator being coupled to the input acoustic wave resonator along a set direction; and
at least one phononic crystal structure between the input acoustic wave resonator and the output acoustic wave resonator,
wherein each of the input acoustic wave resonator and the output acoustic wave resonator is a bulk wave resonator, wherein the input surface is substantially opposite to the output surface, and wherein acoustic waves are guided by the at least one phononic crystal structure along the set direction and the input acoustic wave resonator and the output acoustic wave resonator ensure at least one of an impedance conversion and a mode conversion.

25. An acoustic wave bandpass filter comprising:

an input acoustic wave resonator with an output surface;

an output acoustic wave resonator with an input surface, the output acoustic wave resonator being coupled to the input acoustic wave resonator along a set direction; and at least one of a first phononic crystal structure between the input acoustic wave resonator and the output acoustic wave resonator and a second phononic crystal structure at the periphery of the input acoustic wave resonator and the output acoustic wave resonator so as to guide acoustic waves generated by the input acoustic wave resonator toward the output acoustic wave resonator along the set direction, wherein the output surface has a dimension different from a dimension of the input surface, wherein the input surface is substantially opposite to the output surface, and wherein the acoustic waves are guided along the set direction and the input acoustic wave resonator and the output acoustic wave resonator ensure at least one of an impedance conversion and a mode conversion.

26. An acoustic wave bandpass filter comprising:

an input acoustic wave resonator with an output surface;

an output acoustic wave resonator with an input surface, the output acoustic wave resonator being coupled to the input acoustic wave resonator along a set direction; and a plurality of phononic crystal structures between the input acoustic wave resonator and the output acoustic wave resonator, wherein the input surface is substantially opposite to the output surface, wherein certain phononic crystal structures of the plurality of phononic crystal structures have acoustic wave attenuation coefficients that are different from attenuation coefficients of other phononic crystal structures of the plurality of phononic crystal structures, and wherein acoustic waves are guided along the set direction and the input acoustic wave resonator and the output acoustic wave resonator ensure at least one of an impedance conversion and a mode conversion.

* * * * *

UNITED STATES PATENT AND TRADEMARK OFFICE
CERTIFICATE OF CORRECTION

PATENT NO. : 9,450,563 B2
APPLICATION NO. : 13/879598
DATED : September 20, 2016
INVENTOR(S) : Marie Gorisse et al.

Page 1 of 1

It is certified that error appears in the above-identified patent and that said Letters Patent is hereby corrected as shown below:

In the claims:

Column 11, line 24 In line 7 of claim 6, please replace "from AN" with --from AlN--.

Column 12, line 11 In line 1 of claim 15, please replace "as claimed in claim" with --as claimed in claim 1--.

Signed and Sealed this
Twenty-second Day of November, 2016

Michelle K. Lee
*Director of the United States Patent and Trademark Office*